US010304398B2

(12) United States Patent
Zheng et al.

(10) Patent No.: US 10,304,398 B2
(45) Date of Patent: May 28, 2019

(54) DRIVER INTEGRATED CIRCUIT FOR DRIVING DISPLAY PANEL, DISPLAY DEVICE AND METHOD FOR DRIVING DRIVER INTEGRATED CIRCUIT CAPABLE OF PROVIDING DIFFERENT CURRENT INTENSITIES TO DIFFERENT LENGTH TRANSMISSION WIRES

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Liangliang Zheng, Beijing (CN); Jian He, Beijing (CN); Xia Feng, Beijing (CN); Tingting Jin, Beijing (CN)

(73) Assignees: BOE TECHNOLOGY GROUP CO., LTD., Beijing (CN); HEFEI BOE OPTOELECTRONICS TECHNOLOGY CO., LTD., Heifei, Anhui (CN)

(*) Notice: Subject to any disclaimer, the term of this patent is extended or adjusted under 35 U.S.C. 154(b) by 191 days.

(21) Appl. No.: 15/302,111

(22) PCT Filed: Oct. 9, 2015

(86) PCT No.: PCT/CN2015/091542
§ 371 (c)(1),
(2) Date: Oct. 5, 2016

(87) PCT Pub. No.: WO2016/188009
PCT Pub. Date: Dec. 1, 2016

(65) Prior Publication Data
US 2017/0186388 A1    Jun. 29, 2017

(30) Foreign Application Priority Data
May 28, 2015 (CN) .......................... 2015 1 0283818

(51) Int. Cl.
*G06F 3/038* (2013.01)
*G09G 5/00* (2006.01)
(Continued)

(52) U.S. Cl.
CPC ....... *G09G 3/3648* (2013.01); *G02F 1/13306* (2013.01); *G09G 3/3688* (2013.01);
(Continued)

(58) Field of Classification Search
None
See application file for complete search history.

(56) References Cited

U.S. PATENT DOCUMENTS

2006/0077077 A1* 4/2006 Kwon .................. G09G 3/3241
                                                            341/50
2012/0081410 A1* 4/2012 Yeo ...................... G09G 3/2092
                                                            345/690
(Continued)

FOREIGN PATENT DOCUMENTS

CN  101140734 A   3/2008
CN  101266759 A   9/2008
(Continued)

OTHER PUBLICATIONS

Definition of module, www.dictionary.com/browse/module?s=t, p. 1.*
(Continued)

Primary Examiner — Abdul-Samad A Adediran
Assistant Examiner — Kirk W Hermann
(74) Attorney, Agent, or Firm — Brooks Kushman P.C.

(57) ABSTRACT

A driver IC for driving a display panel, a display device and a method for driving the driver IC are provided. The driver IC is provided with N pins corresponding to N signal transmission lines of the display panel respectively. Each pin is connected to one corresponding signal transmission line
(Continued)

through one transmission wire. The N pins include a first pin and a second pin. The transmission wires include a first transmission wire connected to the first pin and a second transmission wire connected to the second pin and having a length less than the first transmission wire. The driver IC includes a signal generation module configured to generate N driving signals. The N driving signals include a first driving signal corresponding to the first pin and a second driving signal corresponding to the second pin and having a current intensity less than the first driving signal.

15 Claims, 6 Drawing Sheets

(51) Int. Cl.
    *G09G 3/36*     (2006.01)
    *G02F 1/133*     (2006.01)
    *H01L 27/02*     (2006.01)
    *H01L 49/02*     (2006.01)

(52) U.S. Cl.
    CPC .......... *H01L 27/0203* (2013.01); *H01L 28/00* (2013.01); *G09G 2300/0426* (2013.01); *G09G 2310/0278* (2013.01); *G09G 2310/0289* (2013.01); *G09G 2310/0291* (2013.01); *G09G 2330/023* (2013.01)

(56) References Cited

U.S. PATENT DOCUMENTS

| | | |
|---|---|---|
| 2012/0105393 A1 | 5/2012 | Tan et al. |
| 2015/0015553 A1* | 1/2015 | Cho ................... G09G 3/3611 |
| | | 345/208 |

FOREIGN PATENT DOCUMENTS

| | | |
|---|---|---|
| CN | 101388372 A | 3/2009 |
| CN | 201725544 U | 1/2011 |
| CN | 102262851 A | 11/2011 |
| CN | 102881267 A | 1/2013 |
| CN | 103325331 A | 9/2013 |
| CN | 103676256 A | 3/2014 |
| CN | 104537999 A | 4/2015 |
| CN | 104835472 A | 8/2015 |
| JP | 2009175655 A | 8/2009 |
| KR | 100239749 B1 | 1/2000 |
| TW | 200813930 A | 3/2008 |

OTHER PUBLICATIONS

International Search Report and Written Opinion for Application No. PCT/CN2015/091542, dated Jan. 28, 2016, 13 Pages.

* cited by examiner

DRIVER INTEGRATED CIRCUIT FOR DRIVING DISPLAY PANEL, DISPLAY DEVICE AND METHOD FOR DRIVING DRIVER INTEGRATED CIRCUIT CAPABLE OF PROVIDING DIFFERENT CURRENT INTENSITIES TO DIFFERENT LENGTH TRANSMISSION WIRES

CROSS-REFERENCE TO RELATED APPLICATION

This application is the U.S. national phase of PCT Application No. PCT/CN2015/091542 filed on Oct. 9, 2015, which claims priority to Chinese Patent Application No. 201510283818.3 filed on May 28, 2015, the disclosures of which are incorporated in their entirety by reference herein.

TECHNICAL FIELD

The present disclosure relates to the field of display technology, in particular to a driver integrated circuit (IC) for driving a display panel, a display device, and a method for driving the driver IC.

BACKGROUND

Recently, along with the rapid development of the semiconductor technology, portable electronic products and flat-panel display devices have been widely used. Thin film transistor (TFT) liquid crystal displays have been gradually become standard output devices for various electronic products due to advantages such as low operating voltage, being free of radiation, low weight and small volume. Along with increasing integration degree of a display device such as a mobile phone and a flat-panel computer, their thicknesses become smaller and smaller. In addition, a single-core central processing unit (CPU) has been replaced with a multi-core CPU, resulting in increasing power consumption of a system. In the market, there is an increasing demand on a battery life for the mobile phone and the flat-panel computer. Hence, there is an urgent need for system manufacturers and panel manufacturers to reduce the power consumption of the display device.

There are various display panels nowadays, e.g., liquid crystal display panels, light-emitting diode (LED) display panels and organic light-emitting diode (OLED) display panels. A gate driving signal and a data driving signal need to be applied to each kind of the above mentioned display panels through a gate driver IC and a data driver IC, so as to drive the display panel to display an image.

In order to drive the display panel, usually multiple driver ICs are arranged at a non-display region of the display panel, and each driver IC corresponds to multiple signal transmission lines at a display region. Taking the liquid crystal display panel as an example, the signal transmission lines are data lines or gate lines, and the driver ICs are configured to apply data driving signals to the data lines or apply gate driving signals to the gate lines.

SUMMARY

An object of the present disclosure is to provide a driver IC for driving a display panel, a display device, and a method for driving the driver IC, so as to reduce the power consumption of the driver IC.

In one aspect, the present disclosure provides in some embodiments a driver IC for driving a display panel. The driver IC is provided with N pins, and N is an integer greater than or equal to 2. The N pins correspond to N signal transmission lines of the display panel respectively, and each pin is connected to one corresponding signal transmission line through one transmission wire. The N pins include a first pin and a second pin, and the transmission wires include a first transmission wire connected to the first pin and a second transmission wire connected to the second pin and having a length less than the first transmission wire. The driver IC includes a signal generation module configured to generate N driving signals each corresponding to one of the pins. The N driving signals include a first driving signal corresponding to the first pin and a second driving signal corresponding to the second pin and having a current intensity less than the first driving signal.

Optionally, the driver IC is a data driver IC or a gate driver IC.

Optionally, the signal generation module includes: a first signal generation unit configured to generate N initial signals; and a signal adjustment unit configured to adjust current intensities of the initial signals in accordance with lengths of the transmission wires connected to the pins corresponding to the initial signals, to obtain the N driving signals. The driving signals each have a voltage identical to the corresponding initial signal.

Optionally, the signal adjustment unit includes: multiple voltage followers connected to the first signal generation unit; and a control unit configured to determine bias currents for respective voltage followers in accordance with the lengths of the transmission wire connected to the pins corresponding to the initial signals. The control unit is configured to output a first bias current for the voltage follower corresponding to the first pin and a second bias current for the voltage follower corresponding to the second pin, and the first bias current has a current intensity greater than the second bias current.

Optionally, each voltage follower is an operational amplifier, an output end and a reverse-phase input end of which are connected to each other.

Optionally, the control unit is a time controller.

Optionally, the N pins are divided into M groups of pins, M is an integer greater than or equal to 2, and each pin merely belongs to one group. An identical bias current is outputted by the control unit to the pins in an identical group. For any two groups of pins corresponding to the transmission wires having different average length s in the M groups of pins, a length of a longest transmission wire corresponding to one of the two groups of pins is less than a length of a shortest transmission wire corresponding to the other one of the two groups of pins, and a current intensity of the bias current outputted by the control unit to the group of pins corresponding to the transmission wires having a larger average length is greater than a current intensity of the bias current outputted by the control unit to the group of pins corresponding to the transmission wires having a smaller average length.

Optionally, for any two of the N pins connected to the transmission wires having different lengths, a current intensity of the driving signal corresponding to the pin connected to a longer transmission wire is greater than a current intensity of the driving signal corresponding to the pin connected to a shorter transmission wire.

Optionally, for any two of the N pins connected to the transmission wires having different lengths, a current intensity of the bias current outputted by the control unit to the voltage follower corresponding to the pin connected to the longer transmission line is greater than a current intensity of the bias current outputted by the control unit to the voltage follower corresponding to the pin connected to the shorter transmission line.

Optionally, the N signal transmission lines are separated from each other in a first direction, and the lengths of the transmission wires connected to the N signal transmission lines decrease and then increase gradually in the first direction.

In another aspect, the present disclosure provides in some embodiments a display device including the above-mentioned driver IC.

In yet another aspect, the present disclosure provides in some embodiments a method for driving a driver IC for a display panel. The driver IC is provided with N pins, and N is an integer greater than or equal to 2. The N pins correspond to N signal transmission lines of the display panel respectively, and each pin is connected to one corresponding signal transmission line through one transmission wire. The N pins include a first pin and a second pin, and the transmission wires include a first transmission wire connected to the first pin and a second transmission wire connected to the second pin and having a length less than the first transmission wire. The method includes a step of generating N driving signals each corresponding to one of the pins. The N driving signals include a first driving signal corresponding to the first pin and a second driving signal corresponding to the second pin and having a current intensity less than the first driving signal.

Optionally, the driver IC is a data driver IC or a gate driver IC.

Optionally, the step of generating the N driving signals includes: generating N initial signals; and adjusting current intensities of the initial signals in accordance with lengths of the transmission wires connected to the pins corresponding to the initial signals, to obtain the N driving signals. The driving signals each have a voltage identical to the corresponding initial signal.

Optionally, the step of adjusting the current intensities of the initial signals in accordance with the lengths of the transmission wires connected to the pins corresponding to the initial signals includes: determining bias currents corresponding to the N pins in accordance with the lengths of the transmission wires connected to the pins corresponding to the N initial signals. A current intensity of the bias current corresponding to the first pin is greater than a current intensity of the bias current corresponding to the second pin.

Optionally, the step of determining the bias currents corresponding to the N pins in accordance with the lengths of the transmission wires connected to the pins corresponding to the initial signals includes: dividing the N pins into M groups of pins, wherein M is an integer greater than or equal to 2, each pin merely belongs to one group, and for any two groups of pins corresponding to the transmission wires having different average lengths in the M groups of pins, a length of a longest transmission wire corresponding to one of the two groups of pins is less than a length of a shortest transmission wire corresponding to the other one of the two groups of pins; and for any group of pins in the M groups of pins, determining the bias current corresponding to the any group of pins in accordance with the length of the longest transmission wire corresponding to the any group of pins, and outputting the determined bias current to all the pins in the any group of pins. For any two groups of pins corresponding to the transmission wires having different average lengths in the M groups of pins, a current intensity of the bias current outputted to the group of pins corresponding to the transmission wires having a larger average length is greater than a current intensity of the bias current outputted to the group of pins corresponding to the transmission wires having a smaller average length.

Optionally, for any two of the N pins connected to the transmission wires having different lengths, a current intensity of the driving signal corresponding to the pin connected to a longer transmission wire is greater than a current intensity of the driving signal corresponding to the pin connected to a shorter transmission wire.

According to the embodiments of the present disclosure, it is able to adaptively provide different driving signals with different driving capabilities in accordance with different driving requirements, rather than to provide all the driving signals with the maximum driving capability, thereby reducing the power consumption while meeting the driving requirements corresponding to the different driving signals.

DETAILED DESCRIPTION OF THE EMBODIMENTS

Figure 1:
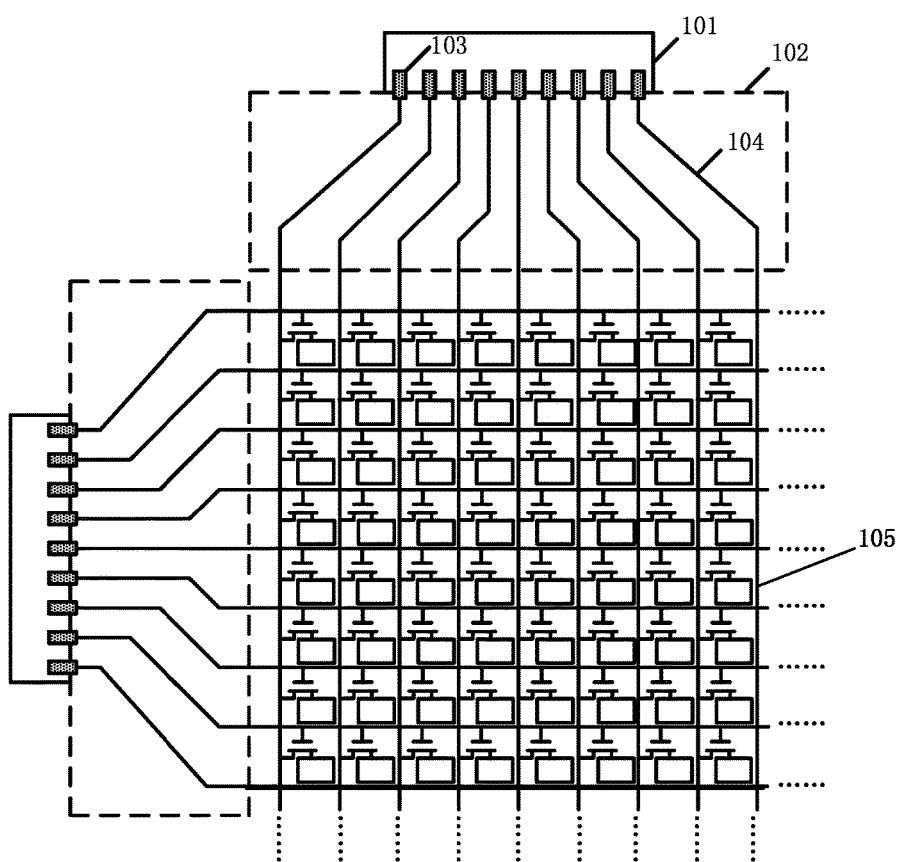
FIG. 1 is a schematic view showing transmission wires connecting a driver IC to signal transmission lines in the related technology.

As shown in FIG. 1, which is a schematic view showing transmission wires connecting a driver IC to signal transmission lines in the related technology, there is a fanout region 102 between a driver IC 101 and signal transmission lines 105. Transmission wires 104 are arranged at the fanout region 102, extending from output pins 103 of the driver IC to a display region of a display panel and connecting the output pins 103 of the driver IC to corresponding signal transmission lines 105. Taking a liquid crystal display panel as an example, the signal transmission lines are gate lines or data lines, and correspondingly, gate driving signals or data driving signals are applied via the transmission wires 104 to the signal transmission lines. Lengths of the transmission wires 104 are not all the same.

Taking the data driving signal as an example, its voltage depends on brightness of a pixel of an image displayed currently by the display panel, and its current is associated with a load. A load for the data driving signal includes a load arranged at the display region and the transmission wire arranged at a non-display region. Usually, loads arranged at the display region included in loads for the data driving signals provided to different signal transmission lines are substantially the same. However, as shown in FIG. 1, the transmission wires transmitting the data driving signals are greatly different from each other in their lengths, resulting in different loads.

The driving signals generated by the driver IC 101 and to be transmitted to the signal transmission lines 105 have an identical driving capability, i.e., an identical current intensity, but the loads corresponding to the driving signals as well as driving requirements corresponding to the driving signals are different from each other. In order to enable the driving signals to meet the different driving requirements, all the driving signals generated by the driver IC 101 need to satisfy the maximum driving requirement. Obviously, in the case that all the driving signals are designed according to the maximum driving requirement, the power consumption is high.

In embodiments of the present disclosure, different driving signals are provided with driving capabilities in accordance with different driving requirements, rather than to satisfy the maximum driving requirement, so as to reduce the power consumption while meet the driving requirements corresponding to the different driving signals.

Figure 2:
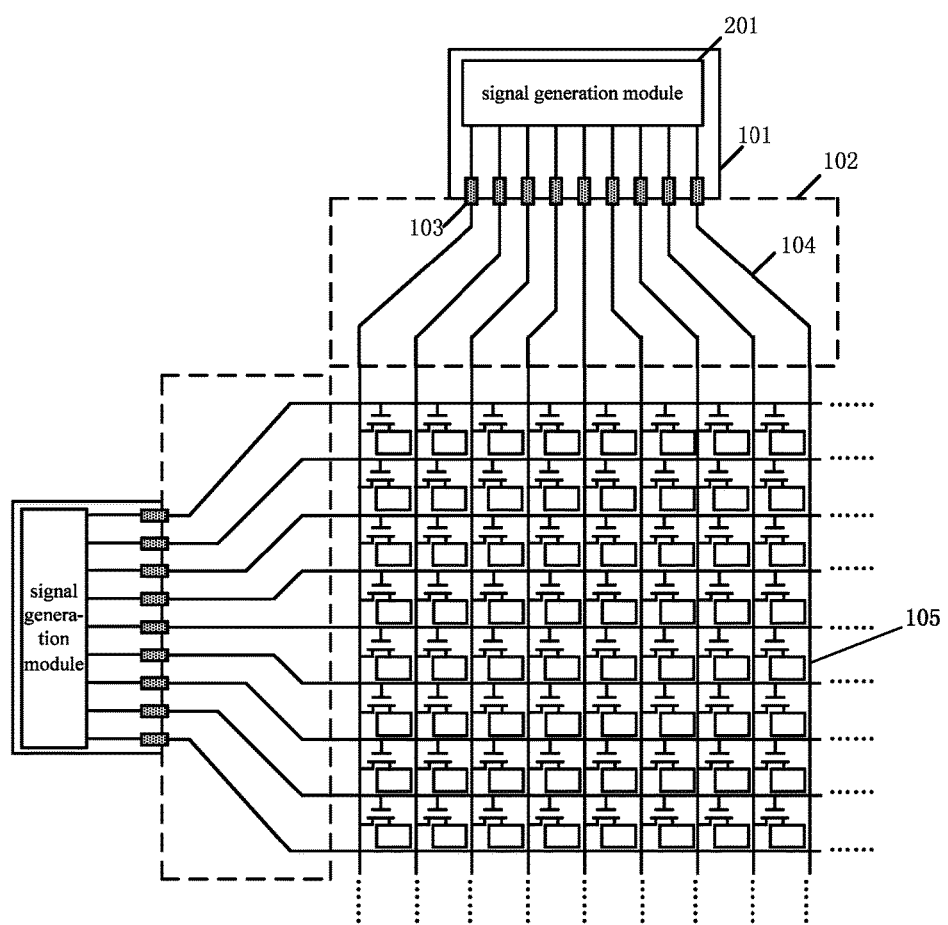
FIG. 2 is a schematic view showing a driver IC for driving a display panel according to an embodiment of the present disclosure.

As show in FIG. 2, the present disclosure provides in some embodiments a driver IC for driving a display panel. The driver IC is provided with N pins 103, where N is an integer greater than or equal to 2. The N pins 103 respectively correspond to N signal transmission lines at a display region of the display panel, and each pin 103 is connected to one corresponding signal transmission line through one transmission wire 104. The N pins include a first pin and a second pin, and the transmission wires 104 include a first transmission wire connected to the first pin and a second transmission wire connected to the second pin and having a length less than the first transmission wire. The driver IC includes a signal generation module 201 configured to generate N driving signals each corresponding to one of the pins. The N driving signals include a first driving signal corresponding to the first pin and a second driving signal corresponding to the second pin and having a current intensity less than the first driving signal.

It should be appreciated that, in the case that the display panel is a liquid crystal display panel, the signal transmission lines may be gate lines or data lines. The driver IC in the embodiments of the present disclosure may be a gate driver IC for applying gate driving signals to the gate lines, or a data driver IC for applying data driving signals to the data lines, or applied to both of them, which are detailed hereinafter.

Apart from different positions, the different data lines or gate lines have identical features. For example, they may be manufactured by an identical process, made of an identical material and connected to identical elements, and the elements may have identical features. Hence, in the case that merely the loads for the driving signals at the display region are taken into consideration, different data lines or gate lines have the same requirement on the driving capabilities.

However, for the driving capabilities of the driving signals, apart from the loads at the display region, the transmission wires arranged outside the display region and configured to connect the pins of the driver IC and the signal transmission lines also need to be taken into consideration. The longer the transmission wire, the higher the needed driving capability of the driving signal. In the embodiments of the present disclosure, different driving signals are adaptively provided with driving capabilities in accordance with different driving requirements, rather than to satisfy the maximum driving requirement, so as to reduce the power consumption while meet the driving requirements corresponding to the different driving signals.

As shown in FIG. 2, the driver IC is provided with 9 pins 103 corresponding to 9 transmission wires 104. The transmission wire 104 in the middle has the smallest length, so the driving signal to be transmitted via the transmission wire 104 may require the smallest driving capability. The leftmost and rightmost transmission wires 104 each have a length far greater than the transmission wire 104 in the middle, so the driving signals to be transmitted via the transmission wires 104 may require the largest driving capability.

It is assumed that a driving capability of the driving signal corresponding to the load at the display region included in the load for the driving signal is a current intensity X, a driving capability of the driving signal corresponding to the longest transmission wire is a current intensity Y, a current intensity of the driving signal corresponding to the transmission wire in unit length is a current intensity Z, and a length different between the shortest transmission wire and the longest transmission wire is A. In the case that all the driving signals are provided with the identical current intensity, the current intensity may be X+Y, so as to enable all the driving signals to be transmitted by the respective transmission wires to meet the requirements on the driving capabilities.

In the embodiments of the present disclosure, the driving signal to be transmitted via the shortest transmission wire has a current intensity less than X+Y, e.g., the current intensity may be set as X+Y−AZ. In this way, it is able to reduce the power consumption while meet the driving requirements corresponding to the different driving signals.

In the case that the driver IC in the embodiments of the present disclosure meet the two conditions, i.e., (1) the driver IC is provided with multiple pins and (2) the transmission wires connecting the multiple pins to corresponding signal transmission lines do not have an identical length, the above-mentioned signal generation module may be used to generate driving signals of different driving capabilities, so as to reduce the power consumption.

Hence, he driver IC in the embodiments of the present disclosure may be applied to a data driver IC or a gate driver IC for a liquid crystal display panel, or a data driver IC or a scanning driver IC for an OLED display panel. Of course, it may also be applied to both of the data driver IC and the gate driver IC for the liquid crystal display panel, or both of the data driver IC and the scanning driver IC for the OLED display panel, which are not detailed herein.

In embodiments of the present disclosure, the signal generation module may be provided in various forms, and one easy implementation will be described hereinafter.

Figure 3:
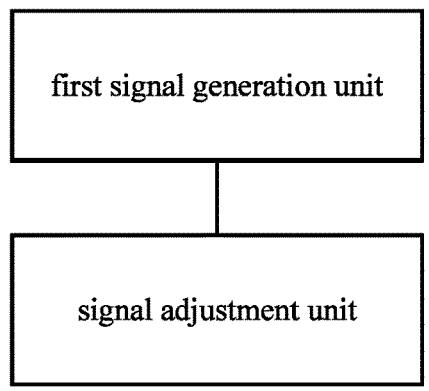
FIG. 3 is a schematic view showing a signal generation module according to an embodiment of the present disclosure.

As shown in FIG. 3, the signal generation module includes a first signal generation unit configured to generate N initial signals, and a signal adjustment unit configured to adjust current intensities of the initial signals in accordance with the lengths of the transmission wires connected to the pins corresponding to the initial signals, so as to obtain the N driving signals. The driving signals each have a voltage identical to the corresponding initial signal.

In embodiments of the present disclosure, different driver ICs may include different first signal generation units. Details will be given as follows by taking the gate driver IC and the data driver IC for the liquid crystal display panel as an example.

Figure 4:
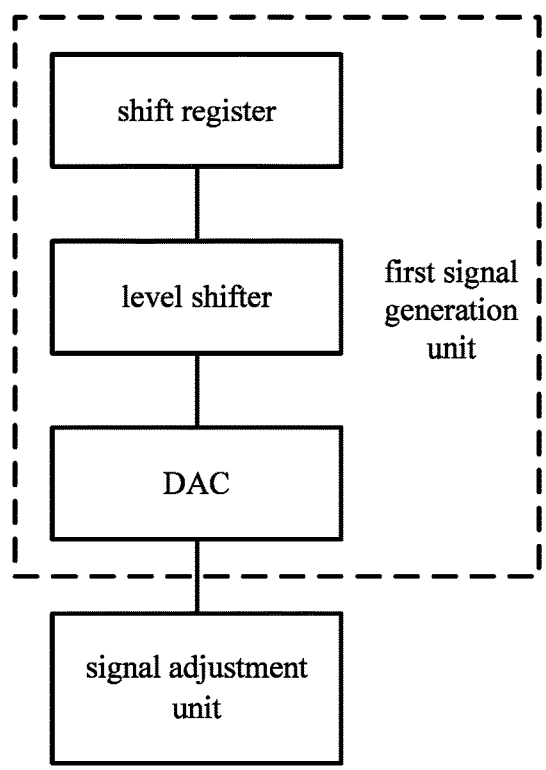
FIG. 4 is a schematic view showing a first signal generation unit of a gate driver IC according to an embodiment of the present disclosure.

In the case that the driver IC is applied to the gate driver IC, it functions as to determine on and off states of scanning lines. At this time, as shown in FIG. 4, the first signal generation unit includes a shift register, a level shifter and a digital-to-analog converter (DAC).

After a clock period each time, the shift register may transmit a logic state of an input stage to an output stage. Hence, at the beginning of each frame, a vertical scanning synchronous signal may be transmitted to a first-level shift register in accordance with a charging time period desired for a pixel electrode, and then time periods for the respective levels of shift registers in an output state may be controlled using a clock signal in the vertical direction, so as to progressively output the logic states for turning on or off the corresponding scanning lines.

The respective levels of shift registers may be designed in such a manner as to perform the scanning in both a direction from top to bottom and a direction from bottom to top, and usually a voltage of 3V or 5V may be applied by the shift registers.

The level shifter functions as to shift low logic voltages of 3V/0V or 5V/0V to an on-state voltage desired for a switch TFT, e.g., greater than 20V, and an off-state voltage desired for the switch TFT, e.g., smaller than −5V, so as to obtain the N initial signals for driving the scanning lines.

In the case that the driver IC is applied to the data driver IC, it is used to generate a control voltage desired for displaying an image. Hence, the first signal generation unit of the data driver IC is different from that of the scanning driver IC. A basic working procedure of the data driver IC will be described as follows. Under the control of the shift registers whose operation time periods are controlled by a horizontal clock signal and a horizontal scanning synchronous signal, a first group of data registers in a closed loop may be turned on one by one, and digital video data to be displayed by the pixels corresponding to an $(n-1)^{th}$ scanning line is stored in the first group of data registers.

After the data to be displayed by the pixels corresponding to one scanning line is stored in the first group of data registers, the data may be transferred to and stored in a second group of data registers in response to a next horizontal scanning synchronous signal, and meanwhile the data is converted by a DAC into corresponding pixel voltages. In this way, it is able to obtain the N initial signals for driving the data lines.

Figure 5:
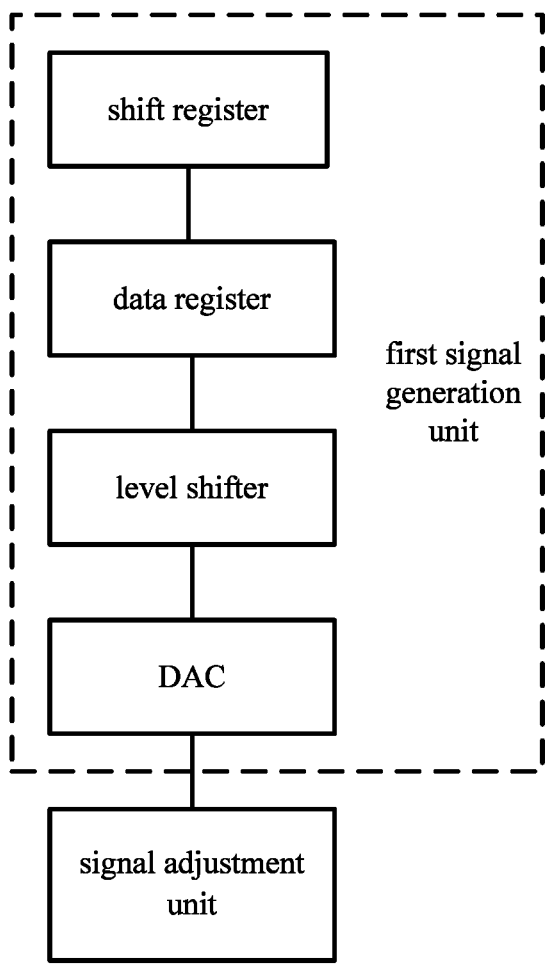
FIG. 5 is another schematic view showing a first signal generation unit of a data driver IC according to an embodiment of the present disclosure.

Hence, as shown in FIG. 5, in the case that the driver IC is applied to the data driver IC, the first signal generation unit includes: a shift register identical to that for the scanning driver IC and having an operating frequency greater than that of the scanning driver IC; a data register configured to store digital data through a closed loop formed by interconnecting output ends and input ends of two phase inverters; a level shifter configured to pull up a low level from the data shifter, e.g., from 0V-5V to 0V-14V; and a DAC configured to convert the digital data into analogue voltages for driving the pixel electrodes.

However, regardless of the data driver IC or the scanning driver IC, the first signal generation unit determines voltages of the driving signals outputted finally, and each of the voltages is constant.

After the voltages of the driving signals have been determined by the first signal generation unit, the driving capabilities of the driving signals depend on current intensities. In the embodiments of the present disclosure, the signal adjustment unit includes multiple voltage followers connected to the first signal generation unit, and a control unit configured to determine bias currents for respective voltage followers in accordance with lengths of the transmission wires connected to the pins corresponding to the initial signals.

Figure 6:
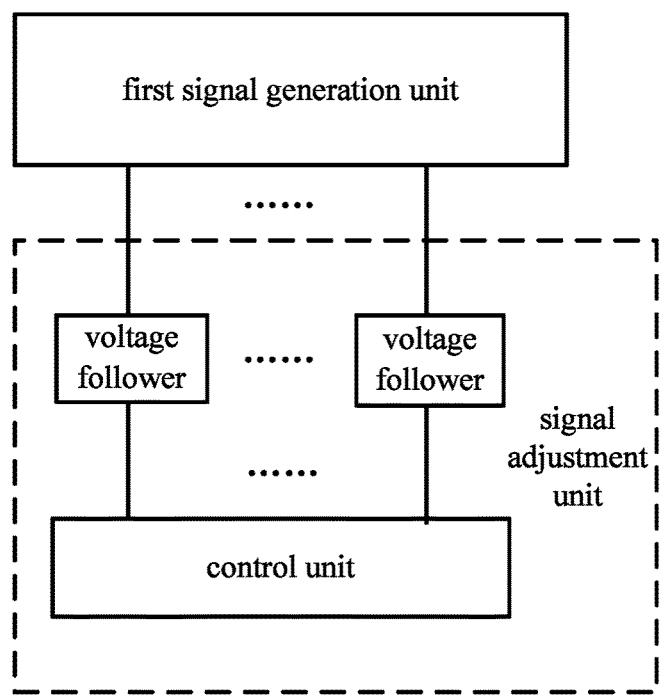
FIG. 6 is a schematic view showing a signal adjustment unit according to an embodiment of the present disclosure.
Figure 7:
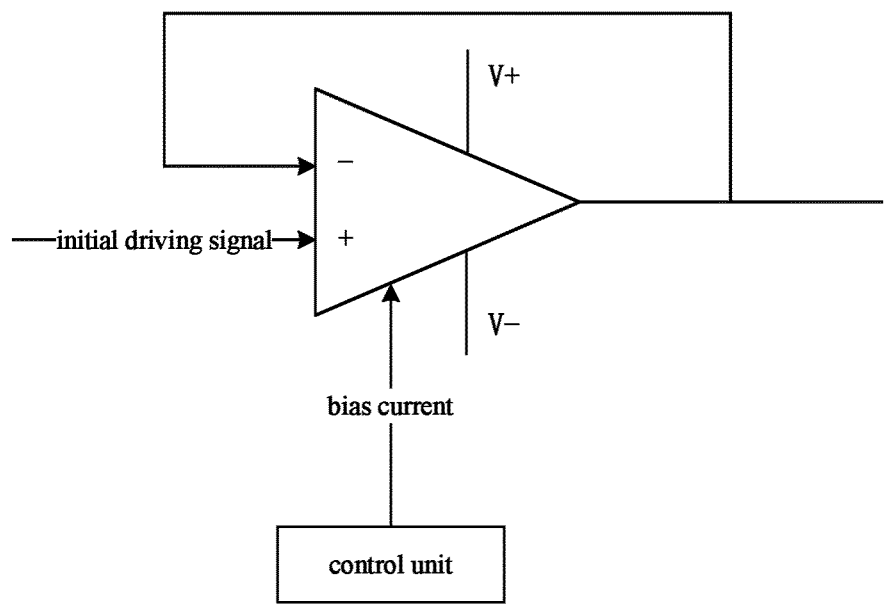
FIG. 7 is another schematic view showing a signal adjustment unit according to an embodiment of the present disclosure.
Figure 8:
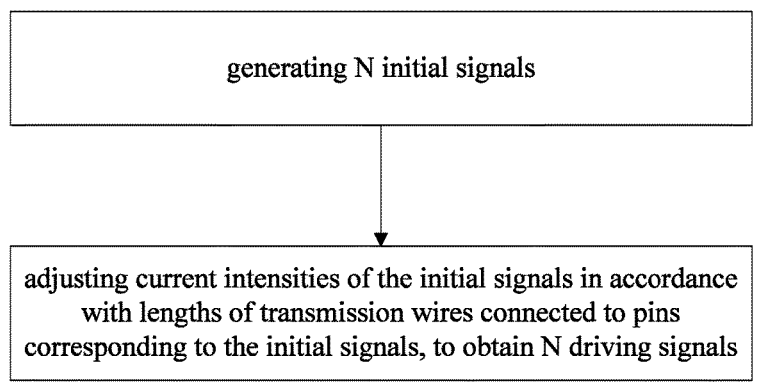
FIG. 8 is a flow chart of a method for driving a driver IC according to an embodiment of the present disclosure.

The control unit outputs a first bias current for the voltage follower corresponding to the first pin, and a second bias current for the voltage follower corresponding to the second pin, and the first bias current has a current intensity greater than the second bias current. Each initial signal has a voltage identical to the corresponding driving signal. The current intensity of the initial signal may be adjusted under the effect of the corresponding bias current, so as to obtain the corresponding driving signal. As shown in FIG. 6, optionally, each voltage follower is an operational amplifier, an output end and a reverse-phase input end of which are connected.

The control unit may be a separate control chip. However, in order to facilitate the implementation and reduce the production cost, according to some embodiments of the present disclosure, the control unit is a time controller (TCON).

Optionally, the voltage followers correspond to the N pins respectively, i.e., there are N voltage followers. The current intensity of the driving signal outputted by each pin may be minimized, so as to minimize the power consumption. In some other embodiments of the present disclosure, each voltage follower may correspond to multiple pins.

There is a relatively large computational burden for minimizing the current intensity of the driving signal outputted by each pin, and meanwhile the controllability of the operational amplifier is highly demanded. In order to reduce the computational burden as well as the requirements on the operational amplifier, in some embodiments of the present disclosure, the pins may be divided into several groups. To be specific, the N pins may be divided into M groups of pins, M is an integer greater than or equal to 2, and each pin merely belongs to one group. An identical bias current is outputted by the control unit to the pins in an identical group. For any two groups of pins corresponding to transmission wires having different average lengths in the M groups of pins, the length of a longest transmission wire corresponding to one of the two groups of pins is less than the length of a shortest transmission wire corresponding to the other one of the two groups of pins, and the current intensity of the bias current outputted by the control unit to the group of pins corresponding to the transmission wires having a larger average length is greater than the current intensity of the bias current outputted by the control unit to the group of pins corresponding to the transmission wires having a smaller average length. More details will be given as follows by taking each of the gate driver IC and the data driver IC as examples.

In the case that the gate driver IC corresponds to (N1+N2+N3+N4+N5) gate lines, it may be provided with (N1+N2+N3+N4+N5) pins, and each pin may be connected to one corresponding gate line via one transmission wire. Depending on the lengths of the transmission wires corresponding to the pins in an ascending order, the pins are numbered as a first pin, a second pin, . . . , an $(N1)^{th}$ pin, . . . , an $(N1+N2)^{th}$ pin, . . . , an $(N1+N2+N3)^{th}$ pin, . . . , an $(N1+N2+N3+N4)^{th}$ pin, . . . , and an $(N1+N2+N3+N4+N5)^{th}$ pin, and these (N1+N2+N3+N4+N5) pins may be divided into 5 groups, i.e., Group 1: 1, 2, . . . , and N1; Group 2: N1+1, N1+2, . . . , and N1+N2; Group 3: N1+N2+1, N1+N2+2, . . . , and N1+N2+N3; Group 4: N1+N2+N3+1, N1+N2+N3+2, . . . , and N1+N2+N3+N4; and Group 5: N1+N2+N3+N4+1, N1+N2+N3+N4+2, . . . , and N1+N2+N3+N4+N5.

It is found that, in any two groups, the length of a longest transmission wire corresponding to one of the two groups of pins is less than the length of a shortest transmission wire corresponding to the other one of the two groups of pins.

At this time, the control unit outputs an identical bias current to the pins in an identical group.

At the display region of the display panel, apart from the positions, the different gate lines have identical features. For example, they may be manufactured by an identical process, made of an identical material and connected to identical elements, and the elements may have identical features. Hence, in the case that merely the loads for the driving signals at the display region are taken into consideration, different gate lines have the same requirement on the driving capabilities. However, in the case that the transmission wires are taken into consideration, the driving signal outputted by the pin corresponding to the longest transmission wire has the most demanding driving capability.

Hence, the minimum bias current desired for different gate lines may be set in accordance with the demanded driving capability of the driving signal outputted by a pin corresponding to a longest transmission wire in an identical group of pins.

Through the above design, for the group of pins corresponding to the transmission wires having a larger average length, the larger bias currents are outputted by the control unit.

The relationship among the bias currents, the groups of pins and the codes of the TCON are shown in the following table.

| serial numbers of pins in each group | level of bias current | code of TCON |
| --- | --- | --- |
| [1, N1] | smallest | 00h |
| [N1 + 1, N1 + N2] | second smallest | 04h |
| [N1 + N2 + 1, N1 + N2 + N3] | intermediate | 08h |
| [N1 + N2 + N3 + 1, N1 + N2 + N3 + N4] | second largest | 0Ch |
| [N1 + N2 + N3 + N4 + 1, N1 + N2 + N3 + N4 + N5] | largest | 0Fh |

Of course, the above description is merely given by taking five groups of pins as an example. In order to reduce the power consumption, the pins may be divided into more groups. The more the groups, the more obviously the power consumption will be reduced.

In the case that the data driver IC corresponds to (M1+M2+M3+M4) data lines, it may be provided with (M1+M2+M3+M4) pins, and each pin may be connected to one corresponding data line via one transmission wire. Depending on the lengths of the transmission wires corresponding to the pins in an ascending order, the pins are numbered as a first pin, a second pin, . . . , an $(M1)^{th}$ pin, . . . , an $(M1+M2)^{th}$ pin, . . . , an $(M1+M2+M3)^{th}$ pin, . . . , and an $(M1+M2+M3+M4)^{th}$ pin, and these (M1+M2+M3+M4) pins may be divided into 4 groups, i.e., Group 1: 1, 2, . . . , and M1; Group 2: M1+1, M1+2, . . . , and M1+M2; Group 3: M1+M2+1, M1+M2+2, . . . , and M1+M2+M3; and Group 4: M1+M2+M3+1, M1+M2+M3+2, . . . , and M1+M2+M3+M4.

It is found that, in any two groups, the length of a longest transmission wire corresponding to one of the two groups of pins is less than the length of a shortest transmission wire corresponding to the other one of the two groups of pins.

At this time, the control unit outputs an identical bias current to the pins in an identical group.

At the display region of the display panel, apart from the positions, the different data lines have identical features. For example, they may be manufactured by an identical process, made of an identical material and connected to identical elements, and the elements may have identical features. Hence, in the case that merely the loads for the driving signals at the display region are taken into consideration, different data lines have the same requirement on the driving capabilities. However, in the case that the transmission wires are taken into consideration, the driving signal outputted by the pin corresponding to the longest transmission wire has the most demanding driving capability.

Hence, the minimum bias current desired for different data lines may be set in accordance with the demanded driving capability of the driving signal outputted by a pin corresponding to a longest transmission wire in an identical group of pins.

Through the above design, for the group of pins corresponding to the transmission wires having a larger average length, the larger bias currents are outputted by the control unit.

The relationship among the bias currents, the groups of pins and the codes of the TCON are shown in the following table.

| serial numbers of pins in each group | level of bias current | code of TCON |
| --- | --- | --- |
| [1, M1] | smallest | 00h |
| [M1 + 1, M1 + M2] | second smallest | 05h |
| [M1 + M2 + 1, M1 + M2 + M3] | second largest | 0Bh |
| [M1 + M2 + M3 + 1, M1 + M2 + M3 + M4] | largest | 0Fh |

Of course, the above description is merely given by taking four groups of pins as an example. In order to reduce the power consumption, the pins may be divided into more groups. The more the groups, the more obviously the power consumption will be reduced.

The present disclosure further provides in some embodiments a display device including the above-mentioned driver IC. The structure and the operating principle of the driver IC have been described hereinbefore, and thus will not be particularly defined herein. The display device may be any product or member having a display function, such as a liquid crystal panel, an electronic paper, a liquid crystal television, a liquid crystal display, a digital photo frame, a mobile phone or a flat-panel computer.

The present disclosure further provides in some embodiments a method for driving a driver IC for a display panel. The driver IC is provided with N pins, and N is an integer greater than or equal to 2. The N pins correspond to N signal transmission lines of the display panel respectively, and each pin is connected to one corresponding signal transmission line through one transmission wire. The N pins include a first pin and a second pin, and the transmission wires include a first transmission wire connected to the first pin and a second transmission wire connected to the second pin and having a length less than the first transmission wire. The method includes a step of generating N driving signals each corresponding to one of the pins. The N driving signals include a first driving signal corresponding to the first pin and a second driving signal corresponding to the second pin and having a current intensity less than the first driving signal.

Optionally, the driver IC is a data driver IC or a gate driver IC.

Optionally, the step of generating the N driving signals includes: generating N initial signals; and adjusting current intensities of the initial signals in accordance with the lengths of the transmission wires connected to the pins corresponding to the initial signals, so as to obtain the N driving signals. The driving signals each have a voltage identical to the corresponding initial signal.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A driver integrated circuit (IC) for driving a display panel, wherein the driver IC is provided with N pins, N is an integer greater than or equal to 2, the N pins correspond to N signal transmission lines of the display panel respectively, each of the N pins is connected to a corresponding one of the signal transmission lines through a corresponding one of N transmission wires, the N pins comprise a first pin and a second pin, the transmission wires each having a length, the transmission wires comprise a first transmission wire connected to the first pin and a second transmission wire connected to the second pin, and the length of the second transmission wire is less than the length of the first transmission wire, wherein the driver IC comprises a signal generation module configured to generate N driving signals each corresponding to one of the N pins, and the N driving signals comprise a first driving signal corresponding to the first pin and a second driving signal corresponding to the second pin, the second driving signal having a current intensity less than the first driving signal, the signal generation module comprises:

a first signal generation unit configured to generate N initial signals; and a signal adjustment unit configured to adjust current intensities of the N initial signals in accordance with the lengths of the transmission wires connected to the N pins corresponding to the N initial signals, to obtain the N driving signals, wherein the driving signals each have a voltage identical to a corresponding one of the N initial signals.

2. The driver IC for driving the display panel according to claim 1, wherein the driver IC is a data driver IC or a gate driver IC.

3. The driver IC for driving the display panel according to claim 1, wherein when N is larger than 2, the N signal transmission lines are separated from each other in a first direction, and the lengths of the transmission wires connected to the N signal transmission lines decrease and then increase gradually in the first direction.

4. The driver IC for driving the display panel according to claim 1, wherein the signal adjustment unit comprises:

a plurality of voltage followers connected to the first signal generation unit; and a control unit configured to determine bias currents for respective ones of the voltage followers in accordance with the lengths of the transmission wires connected to the N pins corresponding to the N initial signals, wherein the control unit is configured to output a first one of the bias currents for one of the voltage followers corresponding to the first pin and a second one of the bias currents for one of the voltage followers corresponding to the second pin, and the first one of the bias currents has a current intensity greater than the second one of the bias currents.

5. The driver IC for driving the display panel according to claim 4, wherein each of the voltage followers is an operational amplifier, an output end and a reverse-phase input end of which are connected to each other.

6. The driver IC for driving the display panel according to claim 4, wherein the control unit is a time controller.

7. The driver IC for driving the display panel according to claim 4, wherein the N pins are divided into M groups of the pins, M is an integer greater than or equal to 2;

wherein the pins in each one of the M groups of the pins are provided with an identical one of the bias currents; and for any two of the M groups of the pins corresponding to respective ones of the transmission wires having different average lengths, the average length of a longest one of the transmission wires corresponding to the pins of one of the two M groups of the pins is less than the average length of a shortest one of the transmission wires corresponding to the pins of the other one of the two M groups of pins, and a current intensity of the bias current outputted by the control unit to the one of the two M groups of the pins corresponding to transmission wires having the larger average length is greater than a current intensity of the bias current outputted by the control unit to the other one of the two M group of the pins corresponding to transmission wires having the smaller average length.

8. The driver IC for driving the display panel according to claim 4, wherein for any two of the N pins connected to a respective pair of the transmission wires the lengths of which differ, a current intensity of the driving signal corresponding to the pin connected to a longer one of the pair of the transmission wires is greater than a current intensity of the driving signal corresponding to the pin connected to a shorter one of the pair of the transmission wires.

9. The driver IC for driving the display panel according to claim 8, wherein for any two of the N pins connected to a respective pair of the transmission wires the lengths of which differ, a current intensity of the bias current outputted by the control unit to one of the voltage followers corresponding to the pin connected to a longer one of the pair of transmission wires is greater than a current intensity of the bias current outputted by the control unit to another one of the voltage followers corresponding to the pin connected to a shorter one of the pair of transmission wires.

10. A display device, comprising a driver integrated circuit, wherein the driver IC is provided with N pins, N is an integer greater than or equal to 2, the N pins correspond to N signal transmission lines of a display panel respectively, each of the pins is connected to a corresponding one of the signal transmission lines through a corresponding one of N transmission wires, the N pins comprise a first pin and a second pin, the transmission wires each have a length, the transmission wires comprise a first transmission wire connected to the first pin and a second transmission wire connected to the second pin, and the length of the second transmission wire is less than the length of the first transmission wire, wherein the driver IC comprises a signal generation module configured to generate N driving signals each corresponding to one of the N pins, and the N driving signals comprise a first driving signal corresponding to the first pin and a second driving signal corresponding to the second pin, and the second driving signal having a current intensity less than the first driving signal, the signal generation module comprises:

a first signal generation unit configured to generate N initial signals; and a signal adjustment unit configured to adjust current intensities of the N initial signals in accordance with the lengths of the transmission wires connected to the N pins corresponding to the N initial signals, to obtain the N driving signals, wherein the driving signals each have a voltage identical to a corresponding one of the N initial signals.

11. A method for driving a driver integrated circuit (IC) for a display panel, wherein the driver IC is provided with N pins, N is an integer greater than or equal to 2, the N pins correspond to N signal transmission lines of the display panel respectively, each of the N pins is connected to a corresponding one of the signal transmission lines through a corresponding one of N transmission wires, the N pins comprise a first pin and a second pin, the transmission wires each having a length, the transmission wires comprise a first transmission wire connected to the first pin and a second transmission wire connected to the second pin, and the length of the second transmission wire is less than the length of the first transmission wire, wherein the method comprises a step of generating N driving signals each corresponding to one of the N pins, and the N driving signals comprise a first driving signal corresponding to the first pin and a second driving signal corresponding to the second pin, the second driving signal having a current intensity less than the first driving signal, the step of generating the N driving signals comprises:
generating N initial signals; and
adjusting the current intensities of the N initial signals in accordance with the lengths of the transmission wires connected to the N pins corresponding to the N initial signals, to obtain the N driving signals,
wherein the N driving signals each have a voltage identical to a corresponding one of the N initial signals.

12. The method according to claim 11, wherein the driver IC is a data driver IC or a gate driver IC.

13. The method according to claim 11, wherein the adjusting the current intensities of the N initial signals in accordance with the lengths of the transmission wires connected to the N pins corresponding to the N initial signals comprises:

determining bias currents corresponding to the N pins in accordance with the lengths of the transmission wires connected to the N pins corresponding to the N initial signals, wherein the current intensity of the bias current corresponding to the first pin is greater than the current intensity of the bias current corresponding to the second pin.

14. The method according to claim 13, wherein the determining the bias currents corresponding to the N pins in accordance with the lengths of the transmission wires connected to the N pins corresponding to the N initial signals comprises:

dividing the N pins into M groups of the pins, wherein M is an integer greater than or equal to 2, and for any two of the M groups of the pins corresponding to respective ones of the transmission wires having different average lengths, the average length of a longest one of the transmission wires corresponding to the pins of one of the two groups of the pins is less than the average length of a shortest one of the transmission wires corresponding to the pins of the other one of the two groups of the pins; and for each one of the M groups of pins, determining a bias current in accordance with the length of the longest transmission wire corresponding to the group of the pins, and outputting the determined bias current to all the N pins in the group of pins, wherein a current intensity of the bias current outputted to the one of the two M groups of the pins corresponding to the transmission wires having a larger one of the average lengths is greater than a current intensity of the bias current outputted to the other one of the two M groups of the pins corresponding to the transmission wires having a smaller one of the average lengths.

15. The method according to claim 11, wherein for any two of the N pins connected to a respective pair of the transmission wires the lengths of which differ, a current intensity of the driving signal corresponding to the pin connected to a longer one of the pair of the transmission wires is greater than a current intensity of the driving signal corresponding to the pin connected to a shorter one of the pair of the transmission wires.

* * * * *